United States Patent
Li et al.

[19]

[11] Patent Number: 6,116,186
[45] Date of Patent: Sep. 12, 2000

[54] APPARATUS FOR COOLING A PLASMA GENERATOR

[75] Inventors: Steven T. Li, Cupertino, Calif.;
Andrew J. Ruspini, Hillsdale, N.J.;
Henry Ho, San Jose, Calif.

[73] Assignee: Applied Materials, Inc., Santa Clara, Calif.

[21] Appl. No.: 09/045,166

[22] Filed: Mar. 19, 1998

[51] Int. Cl.[7] .................................................. C23C 16/00
[52] U.S. Cl. ............................ 118/723 ER; 118/723 IR; 156/345 HG; 204/298.37
[58] Field of Search .................. 118/723 R, 723 CB, 118/723 ER, 723 ME, 723 I, 723 IR; 156/345, 345 C, 345 HG; 204/298.36, 298.37; 315/111.71; 361/231, 233

[56] References Cited

U.S. PATENT DOCUMENTS

| | | | |
|---|---|---|---|
| 4,368,092 | 1/1983 | Steinberg et al. | 156/345 |
| 5,231,334 | 7/1993 | Paranjpe | 315/111.21 |
| 5,304,282 | 4/1994 | Flamm | 156/643 |

*Primary Examiner*—John Sheehan
*Assistant Examiner*—Andrew L. Oltmans
*Attorney, Agent, or Firm*—Blakely Sokoloff Taylor & Zafman

[57] ABSTRACT

An apparatus comprising a semiconductor processing chamber, a plasma generator, and a pipe connecting a semiconductor processing chamber and the plasma generator. The plasma generator includes a generation chamber, a radio frequency generator which generates an ion plasma within the generation chamber, a magnetic device which confines the plasma primarily within a center region of the generation chamber, and a thermally conductive member disposed around the outer surface of the generation chamber for removing heat away from the chamber.

14 Claims, 9 Drawing Sheets

APPARATUS FOR COOLING A PLASMA GENERATOR

RELATED APPLICATION

This application is also related to co-pending application Ser. No. 09/045,165, filed Mar. 19, 1998, entitled "An Apparatus and Method for Generating a Plasma", and assigned to the Assignee of the present application.

BACKGROUND TO THE INVENTION

1). Field of the Invention

The present invention relates generally to cleaning of semiconductor processing chambers and auxiliary equipment such as interconnecting pipes. More specifically, the present invention relates to a system and a method wherein an ion plasma is generated externally of a semiconductor processing chamber and the ion plasma is then introduced into the semiconductor processing for cleaning purposes, and to cooling of such a system.

2). Discussion of Related Art

Semiconductor chips are manufactured by processing a wafer in respective semiconductor processing chambers. Such processing may include chemical vapor deposition, physical vapor deposition, high density plasma deposition, or any other processing which is known in the art. The processing chamber used for each process is designed for purposes of carrying out the respective process. Various contaminants build up within the processing chamber and have to cleaned out from time to time. Such contaminants may include process byproducts, oxides or acidic particles.

A system is therefore required for cleaning the processing chamber, under controlled conditions. More particularly, a system is required wherein the above objectives are achieved in a system which is efficiently and conveniently cooled.

SUMMARY OF THE INVENTION

The present invention provides a plasma generating system comprising a chamber for containing a gas, an inlet into the chamber, an outlet from the chamber, and a member located externally of the chamber, the member having a fluid flow passage therethrough, and a source of alternating current connected to the member to supply alternating current to the member. When alternating current is supplied to the member, the member causes an alternating electromagnetic field within the chamber resulting in the transformation of the gas into a reactive ion plasma. The member is thermally connected to an outer wall of the chamber so as to conduct heat from the wall of the chamber to the member and from the member into a coolant flowing through the fluid flow passage.

BRIEF DESCRIPTION OF THE DRAWINGS

The invention is further described by way of example with reference to the accompanying drawings wherein.

DESCRIPTION OF PREFERRED EMBODIMENT

In the following description, for purposes of explanation, numerous details are set forth in order to provide a thorough understanding of the present invention. However, it will be apparent to one skilled in the art that these specific details are not required in order to practice the present invention. Certain specifics regarding apparatus, materials, dimensions, process parameters and results are recited. These and other specifics are recited in order to provide an example of a workable embodiment of the invention, and may be altered according to preference or requirement without departing from the broader scope of the invention.

The following description relates to an apparatus and a method of cleaning a semiconductor processing chamber. A gas is introduced into a plasma generation chamber and vibrated at radio frequency. Vibration of the gas causes disassociation of the gas into reactive ions. The ions then flow out of the generation chamber through a pipe and into a semiconductor processing chamber. The gas is then allowed to clean the semiconductor processing chamber by reacting with contaminants therein.

Figure 1:
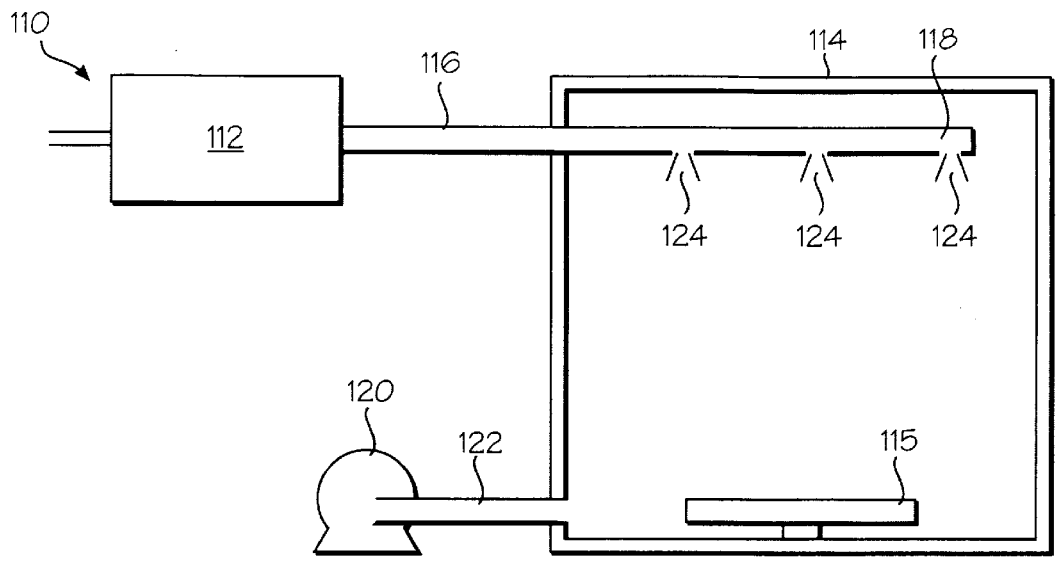
FIG. 1 is a partially sectioned side view illustrating a system according to the invention.

FIG. 1 of the accompanying drawings illustrates a system 110 according to one embodiment of the present invention. The system 110 includes a plasma generator 112, a semiconductor processing chamber 114, a pipe 116 connecting the plasma generator 112 and the semiconductor processing chamber 114 with a shower head portion 118 of the pipe 116 extending into the semiconductor processing chamber 114, and a pump 120 with a low pressure side 122 connected to the semiconductor process chamber 114.

The semiconductor processing chamber 114 usually contains a susceptor 115 and may be a chemical deposition chamber, a physical deposition chamber, a high density plasma deposition chamber, a reactive etch chamber, or any other semiconductor processing chamber which is known in the art, regardless of the purpose that it serves. In the embodiment described, the plasma generator 112 generates fluorine ions which are introduced into the semiconductor processing chamber 114 through the pipe 116 for purposes of cleaning the semiconductor processing chamber 114. The walls of the semiconductor processing chamber 114 and any other components located within the semiconductor processing chamber 114 will therefore be made of materials which can be cleaned with fluorine ions without undue damage thereto. A material which can be cleaned with fluorine ions is aluminum.

The pipe 116 is made of aluminum and is formed with a number of openings 124 in the shower head portion 118. The openings 124 are spaced from one another so as to be spread out over the width of the semiconductor processing chamber 114.

Figure 2:
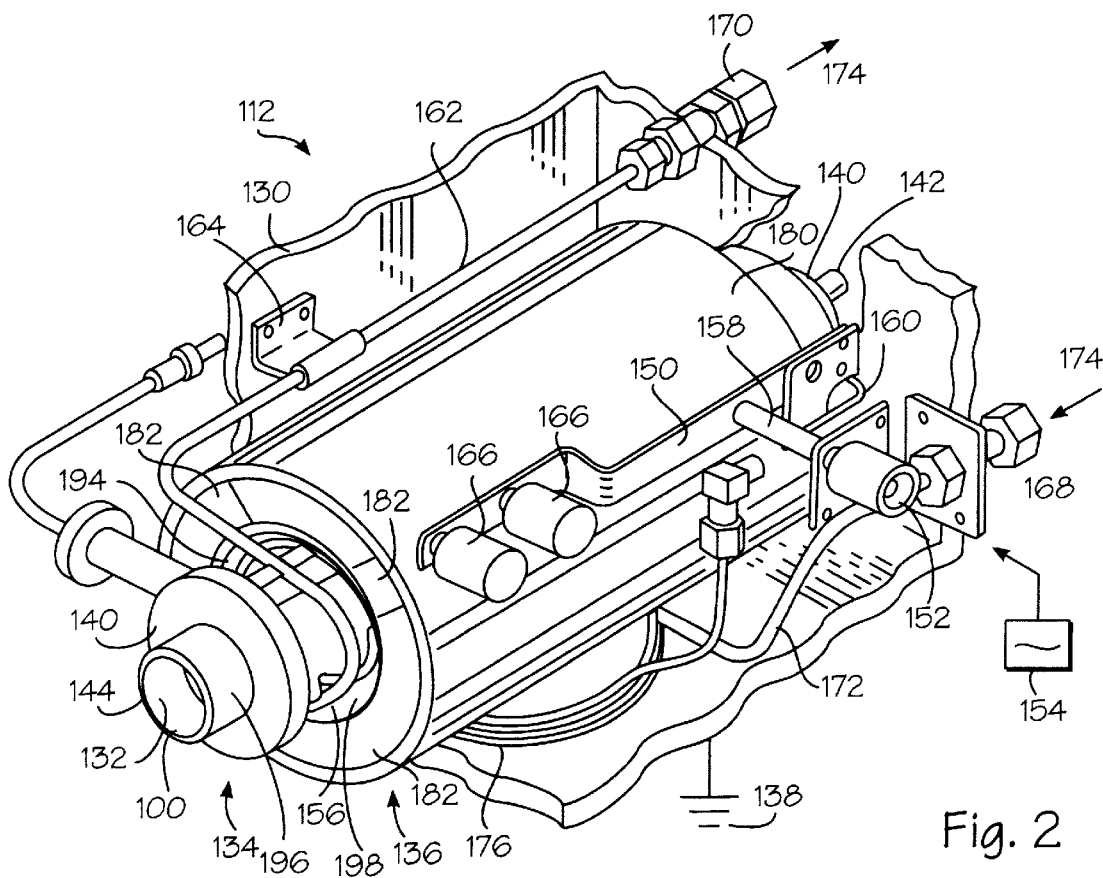
FIG. 2 is a partially sectioned perspective view of a plasma generator for use in the system of FIG. 1.

FIG. 2 is a perspective view of the plasma generator 112 of FIG. 1. The plasma generator 112 includes a housing 130 and respectively a tubular generation chamber 132, a radio frequency generator 134 and a magnetic device 136 mounted within the housing 130. The radio frequency generator 134 is used to generate a reactive ion plasma within the generation chamber 132 and the magnetic device 136 is used to control the reactive ion plasma within the generation chamber 132.

The housing 130 is typically made of aluminum for low magnetization reasons and is connected to ground 138. Although only a section of the housing 130 is shown, it should be understood that the housing surrounds the generation chamber 132, the radio frequency generator 134 and the magnetic device 136.

The generation chamber 132 extends along the length of the housing 130 with rings 140 supporting the generation chamber 132 within opposing walls of the housing 130. A gas inlet 142 is provided at one end of the generation chamber 132 and an opposing end of the generation chamber 132 is open with a much larger ion outlet 144. The generation chamber 132 is typically made of sapphire and has an inner diameter of about 25 mm, a wall thickness of about 1.6 mm, and a length of about 250 mm. The dimensions of the generation chamber 132 are not important for purposes of the invention and are given merely for purposes of providing an example of a workable embodiment of the invention.

The radio frequency generator 134 includes a bracket 150, a connector 152, a radio frequency source 154, and a coil 156. Coil 156 is generally of a tubular construction and is typically made of copper with an external silver plating.

The bracket 150 and the connector 152 are located on opposing sides of a wall (not shown) of the housing 130 and an electrically conductive link 158 connects the bracket to the connector 152. The radio frequency source 154 is connected to the connector so that alternating current within the radio frequency range is supplied to the bracket 150.

The coil 156 spirals around the generation chamber 132, and has a first end 160 which is secured to the bracket 150. A second end 162 of the coil 156 is mounted to a wall of the housing 130 by means of a bracket 164. The second end 162 is thus connected to the ground 138 via the housing 130. The brackets 150 and 164 support the coil 156 substantially concentrically around the generation chamber 132. Alternating current can thus be supplied to the coil 156 by operation of the radio frequency source 154. The coil 156 typically has about five to ten turns. It is appreciated, however, that the invention is not limited to any specific number of coil turns. The number of turns will generally increase with the dimensions of the generation chamber 132 in order to ensure sufficient coverage around the generation chamber 132.

Capacitors 166 bridge the bracket 150 and a wall of the housing 130. The capacitors 166 are selected to match the frequency supplied by the radio frequency source with the conductance characteristics of the coil 156 so that the alternating power delivered to the coil 156 is tuned for optimal reasons.

A water inlet connector 168 and a water outlet connector 170 extend through a wall of the housing 130. A flexible pipe 172 connects the water inlet connector 168 to the first end 160 of the coil 156. Water 174 can thus be introduced into the water inlet connector 168 which then flows through the flexible pipe 172 into the first end 160, whereafter the water flows through the coil and out of the water outlet connector 170. The temperature of the coil 156 can so be controlled.

It should be noted that electric power, in the form of the radio frequency source 154, and a supply of water are both connected to the first end 160, which could be hazardous. The electrically non-conductive flexible pipe 172 is, however, sufficiently long so as to increase the resistance of the water 174 flowing therethrough. The water 174 entering through the water inlet connector 168 is thus safe and power loss to the water is minimized. The majority of the flexible pipe 172 is a roll 176 lying on a floor of the housing 130. The second end 162 of the coil 156 is grounded by means of the bracket 164, thus making safe the water leaving the coil 156.

The magnetic device 136 is in the form of tubular member 180 located around the coil 156. (See FIG. 3.) The tubular member 180 includes four permanent magnets 182 which extend along the length thereof. The magnets 182 oppose one another with the generation chamber 132 located between the magnets 182. The magnets create a magnetic field of between 200 and 4000 Gauss, typically about 2000 Gauss. The magnetic field created by the magnets may be adjusted to meet the performance requirements of a particular application.

Figure 4:
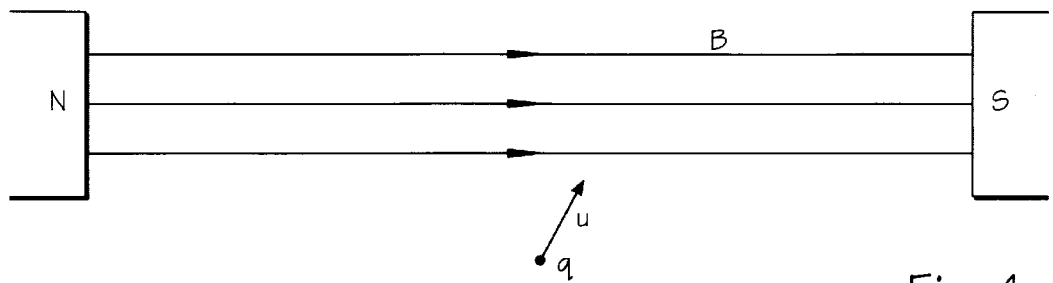
FIG. 4 illustrates a particle with an electric charge which is moving into a magnetic field.

FIG. 4 is a representation of a particle with an electric charge q which moves into a magnetic field. The magnetic field has a magnetic flux density B and the particle moves with a velocity u. A force f is created on the particle according to the vector notation:

$$f = qu \times B.$$

The force f is in a direction which is normal to a plane containing u and B. The force f thus causes deflection of the particle so that the particle is prevented from moving through the magnetic field.

Figure 5:
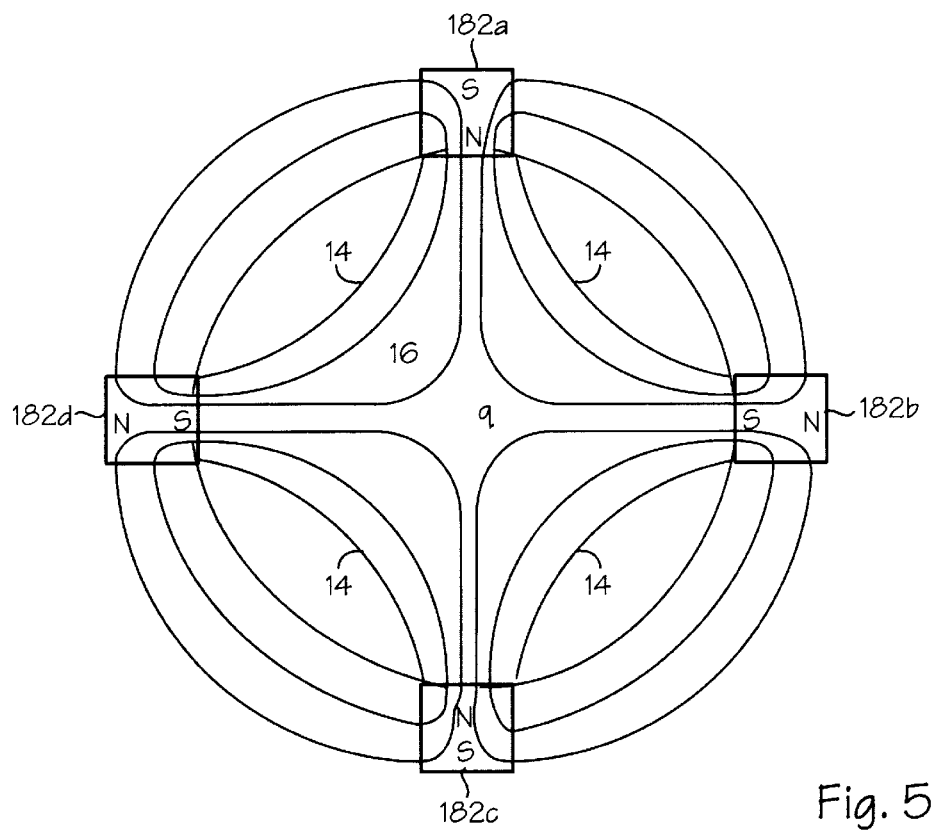
FIG. 5 shows four magnets facing one another and a particle with an electric charge located in an area between the magnets.

FIG. 5 represents a magnetic field 14 that is produced by the magnets 182 of magnetic device 136. The magnets 182 are used for confining a particle with an electric charge q. Opposing magnets 182a and 182c are polarized with north facing one another and opposing magnets 182b and 182d are polarized with south facing one another. A magnetic field 14 runs through an area 16 between the magnets 182 and from one magnet to an adjacent magnet. The particle with an electric charge q is located within the area 16. Movement of the particle into the magnetic field results in a force acting upon the particle which deflects the particle as hereinbefore described. Continuous deflection of the particle results in the particle being confined primarily within a center region of the area 16. The center region of the area 16 typically corresponds to the center region of the generation chamber 132.

Figure 6:
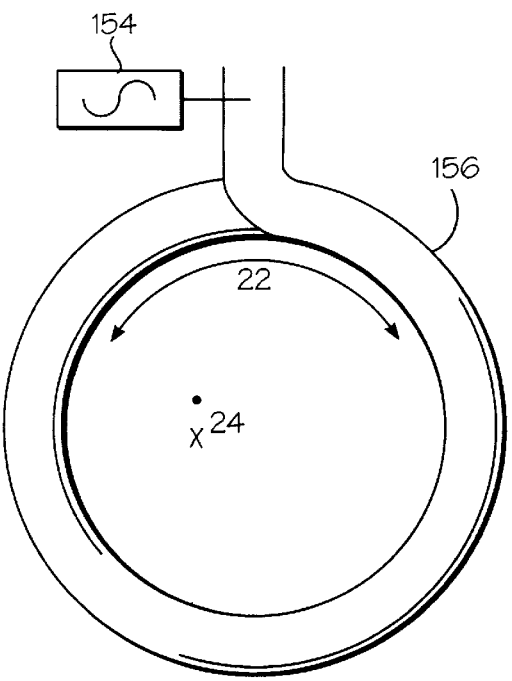
FIG. 6 is an end view of an electric coil which is connected to an alternating current source.
Figure 7:
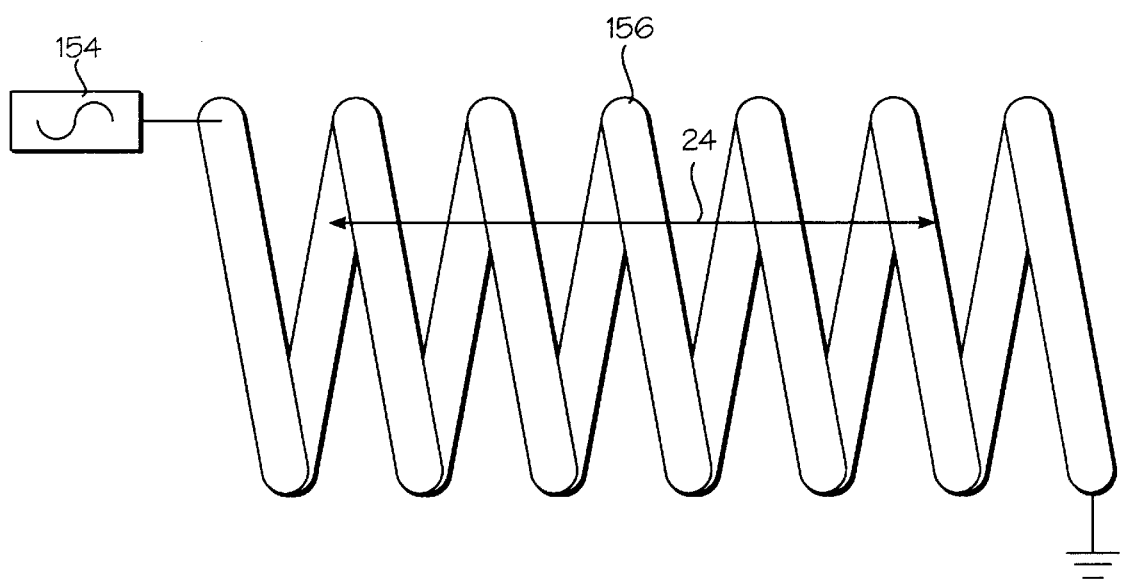
FIG. 7 is a side view of the coil of FIG. 7.

FIGS. 6 and 7 are end and side views of an electric coil 156 which is connected to a radio frequency source 154, such as an alternating current source.

An electromagnetic field is created by the electric coil 156. The electromagnetic field comprises an alternating electric field 22 and an alternating magnetic field 24. The alternating electric field 22 is created within the coil 156 when the alternating current source is operated. The electric field 22 is circular with a center point corresponding to the center of the coil 156.

The alternating magnetic field 24 is also created within the coil 156 when the alternating current source is operated. The magnetic field 24 forms along the length of the coil 156. The magnetic field 24 is substantially perpendicular to the magnetic field 14 and there is little or no interaction between the magnetic fields 14 and 24.

The electric field 22 and the magnetic field 24 may be utilized for actuating gas particles so that the gas particles are dissociated into ionized particles. The gas particles are dissociated by vibration in the directions of both the electric field 22 and the magnetic field 24. The electric field 22 and the magnetic field 24 acting in unison causes the gas particles to spin, which results in dissociation of the gas particles into ionized particles. Any dissociation is, of course, dependent on the current and frequency provided by alternating current source 154.

It should be noted that the gas particles and the ionized particles are activated in the directions of the electric field 22 and the magnetic field 24 only. There is thus no component of movement of the gas particles or the ionized particles in a direction away from the center axis towards the coil 156. Possible damage to the coil due to contact by the gas particles or ionized particles is therefore prevented.

Figure 3:
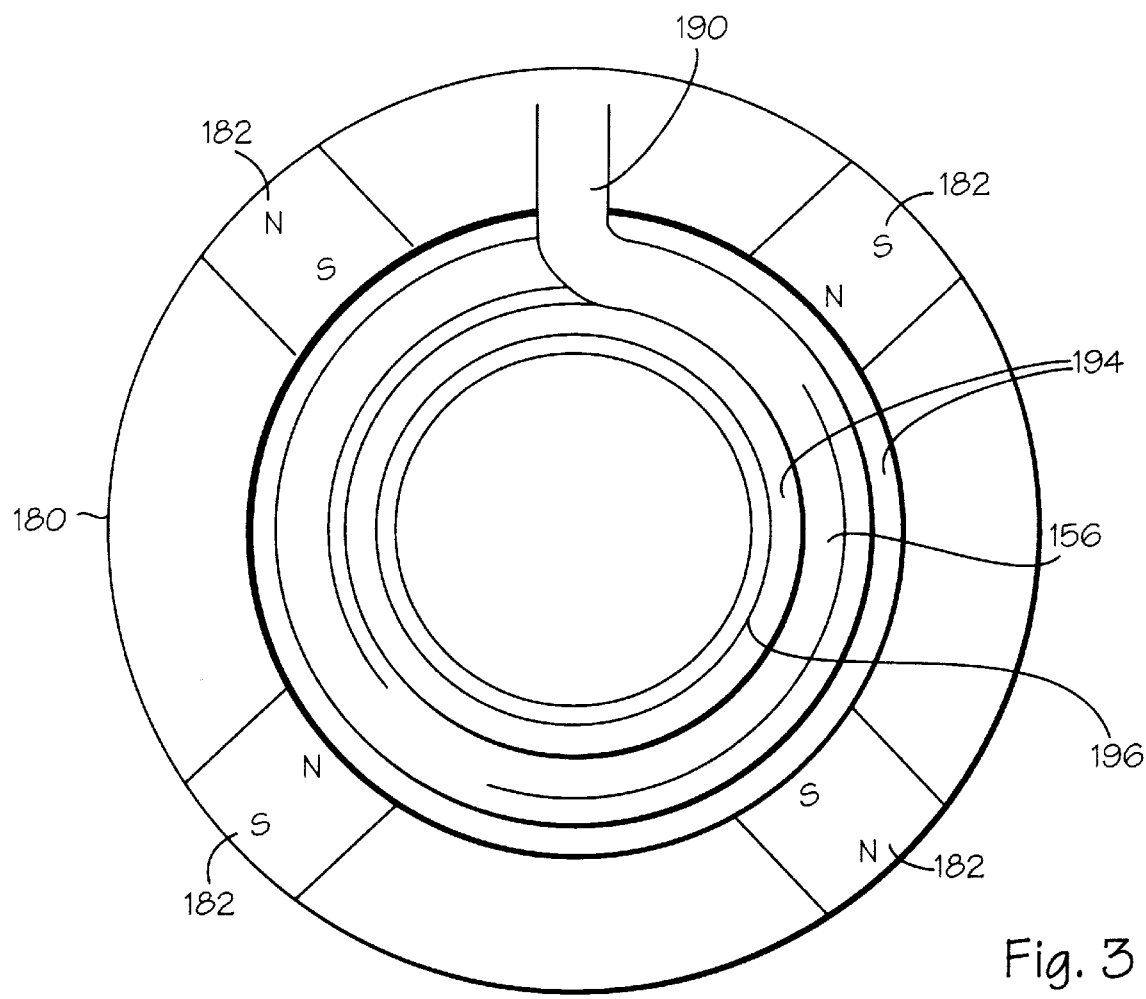
FIG. 3 is an end view of a portion of the plasma generator of FIG. 2 having a thermally conductive member disposed around a portion of a generation chamber and coils.

FIG. 3 is an end view of the components shown in FIG. 2, and shows the generation chamber 132, the coil 156 around the generation chamber 132, and the tubular member 180, including the magnets 182, around the coil 156.

FIG. 2 illustrates the generation chamber 132, the coil 156 spiraling around the generation chamber 132, and two of the magnets 182 located on opposing sides of the coil 156. The radio frequency source 154 is connected to the coil 156. The coil 156 is shown with an opening 190 extending through the length thereof. Coolant 192, in use, flows through the opening 190 for purposes of cooling the coil 156 when alternating current is supplied to the coil 156 by the radio frequency source 154.

FIG. 2 also shows a member 194 which is located so that the generation chamber 132 is also cooled by the coolant 174 flowing through the opening. The member 194 surrounds the generation chamber 132 and is in contact with an outer surface 196 of the generation chamber 132. The member 194 also encompasses respective turns 198 of the coil 156.

In an alternative embodiment, coil 156 is an integral part of member 194. In such an embodiment, cooling passages having electrically conductive walls are provided within member 194.

In use, the radio frequency source 154 is operated so as to create a frequency within the radio frequency range of between about 300 kHz and 300 MHz. Such a frequency may be about 13.56 MHz, about 2 MHz, or between 350 kHz and 500 kHz. Electric power of between 100 W and 2 kW is supplied to the radio frequency source 154. An alternating current within the radio frequency range is thus created within the coil 156. An alternating electric field and an alternating magnetic field are also created as hereinbefore described with reference to FIGS. 6 and 7.

A gas, such as $NF_3$, is then introduced through the gas inlet 142 into the generation chamber 132. The gas is then dissociated into a reactive ion plasma containing nitrogen and fluorine ions, as also hereinbefore described with reference to FIGS. 6 and 7. The fluorine ions are very reactive and may cause damage to the generation chamber 132 should they come into contact with the generation chamber 132. The magnets 182 are arranged as previously described with reference to FIG. 2 so that they confine the fluorine ions primarily in a center region of the generation chamber 132. The fluorine ions are thus continuously deflected away from an inner wall of the generation chamber 132. Damage to the generation chamber by the ions is thereby prevented and reduction in wall bombardment minimizes cooling requirements of the chamber 132.

The $NF_3$ molecules are dissociated by spinning caused by the electrical field and the magnetic field generated by the coil 156, as previously described. The magnetic field created by the magnets 182 assists in further spinning the $NF_3$ ions so that the $NF_3$ molecules are dissociated at a faster rate and more effectively than with the coil 156 alone.

The electric field vibrates the molecules in a circular path with a center point corresponding to the center of the generation chamber 132 and the magnetic field vibrates the $NF_3$ molecules in a direction which is along the length of the generation chamber 132 so that movement of the $NF_3$ molecules, or the fluorine ions, is not in a direction which is towards an inner wall of the generation chamber 132. The forces acting on the molecules are therefore not in a direction which would cause damage to the generation chamber 132.

A large amount of heat builds up within the generation chamber 132 during generation of ions. The heat is transferred to a wall 100 of the generation chamber 132 and then through the wall to the outer surface 196 of the generation chamber 132. The member 194 serves to conduct the heat from the surface 196 to the turns 198 of the coil 156. The heat is then transferred through the material of the coil 156 to the coolant 174 flowing within the opening 190. The coolant 174, which is used for purposes of cooling the coil 156 during operation of the coil, thus serves a secondary function which is to cool the wall 100 of the generation chamber 132 and the gas and ions within the generation chamber 132.

Member 194 is made of a material having a relatively high thermal conductivity. It should be noted that, in the embodiment described, the turns 198 of the coil 156 are encased within member 194. Since coil 156 is electricity conductive, it is required that the member 194 be made of an electrically insulative material.

In addition, since the member 194 is located between the surface 196 of the generation chamber 152 and the respective magnets 182, and the magnets are required to generate a magnetic field within the generation chamber 132, it is also required that the material that the member 194 is made of a material that does not absorb or adversely interfere with the magnetic fields.

A material that complies with all the above characteristics is sold under the name Prima-Bond ME7558 by AI Technology of 9 Princess Road, Lawrenceville, N.J. ME7558 is a reworkable, aluminum nitride filled, electrically insulating and thermally conductive epoxy paste adhesive which exhibits flexibility for bonding materials with fairly highly mismatched coefficients of thermal expansion. The epoxy paste adhesive material may be provided in a container that is large enough to accommodate the chamber 132 and coil 156. The coil 156 and the generation chamber 132 would then jointly be inserted into the container so that the material forms a mold around the generation chamber 132 and the coil 156.

Once the fluorine ions are formed, they flow from the generation chamber 132 through the ion outlet 144. The ion outlet 144 is much larger than the gas inlet 142 so as not to unnecessarily restrict the flow of the reactive fluorine ions.

It should be noted that the fluorine ions are magnetically confined while they are being formed. It should also be noted that the $NF_3$ gas is dissociated while the fluorine ions are magnetically confined within the generation chamber 132, while the gas flows into the generation chamber through the gas inlet 142, and while the ions are flowing out of the generation chamber 132 through the ion outlet 144.

The fluorine ion plasma then flows through the pipe 116 to the shower head portion 118 from where it is sprayed into the semiconductor processing chamber 114 through the openings 124. The pipe 116 and the shower head portion 118, being made of aluminum, are relatively resistant to attack by the fluoride ions so that minimal damage is caused to the pipe 116 or the shower head portion 118 when the fluorine ions flow therethrough. Introduction of the fluorine ion plasma into a semiconductor processing chamber 114 causes the fluorine ions to react with contaminants such as oxides, deposition byproducts, acidic particles or other contaminants within the semiconductor processing chamber 114. Any products resulting from the reaction are then pumped out of the semiconductor processing chamber 114 by means of the pump 120.

A higher plasma density can be created by generating the plasma under controlled conditions within a specifically designed plasma generation system, when compared to generating a similar plasma within a semiconductor processing chamber 114 utilizing the same techniques. A fluorine ion plasma density of about $10^{14}/cm^3$ can generally be created when a 2 kW frequency of 13.56 MHz is applied to the coil 156 and the magnets 182 create a magnetic field of about 2000 Gauss.

By locating the source of fluorine ions externally of the semiconductor processing chamber 114, allows for introduction of the fluorine ion plasma at more accurately selected locations within the semiconductor processing chamber 114. The fluorine ion plasma may also be introduced into the semiconductor processing chamber 114 in a pre-set manner, such as by spraying the fluorine ion plasma into the semiconductor processing chamber 114.

Although the description has been directed mainly at the use of a radio frequency generator for dissociating a gas, it should be understood that the invention is not limited to such dissociation of a gas. Other methods of dissociating a gas may also be used, including dissociation by means of a device emanating microwave frequency.

Figure 8:
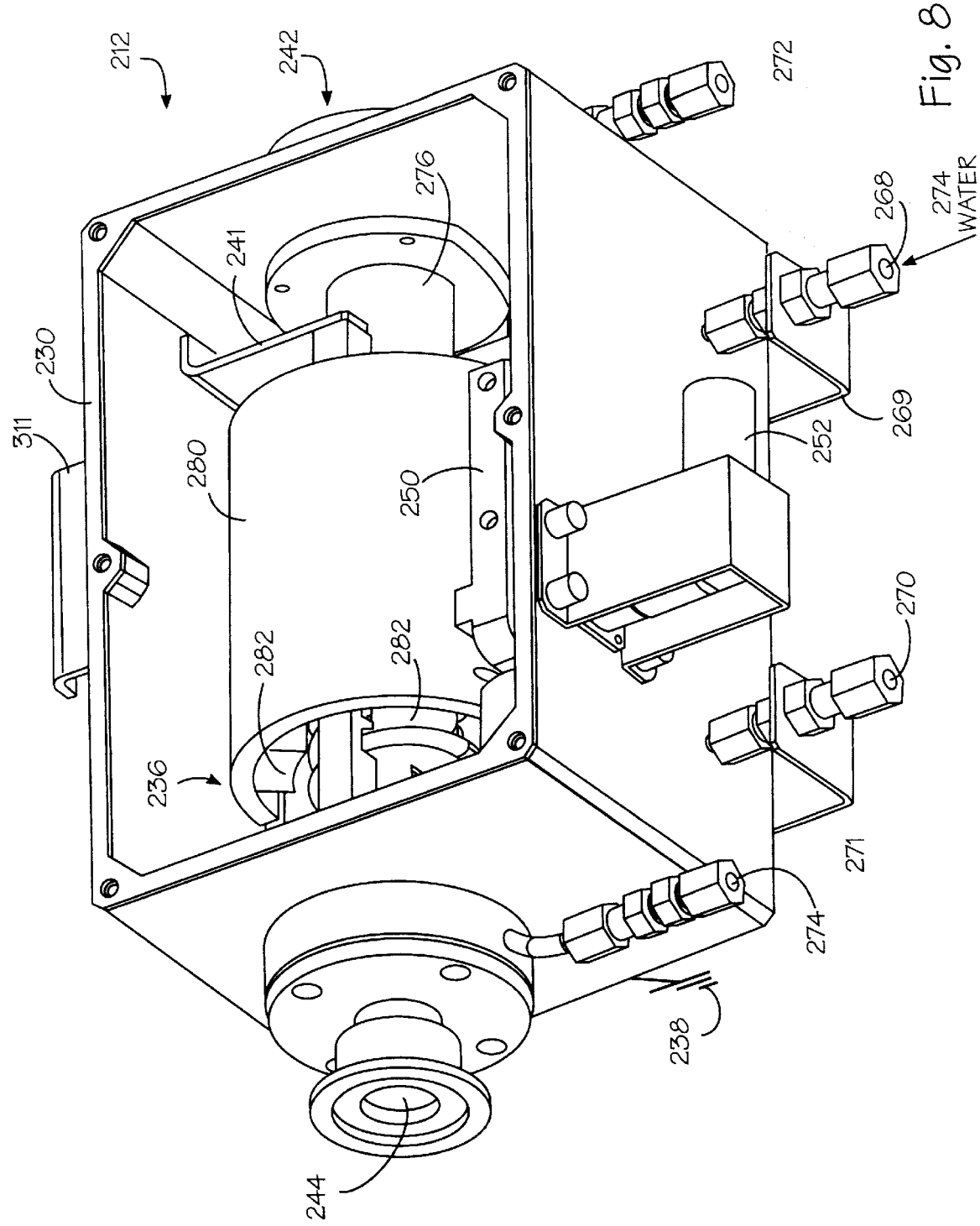
FIG. 8 is a perspective view of a plasma generator in another embodiment of the present invention.
Figure 9:
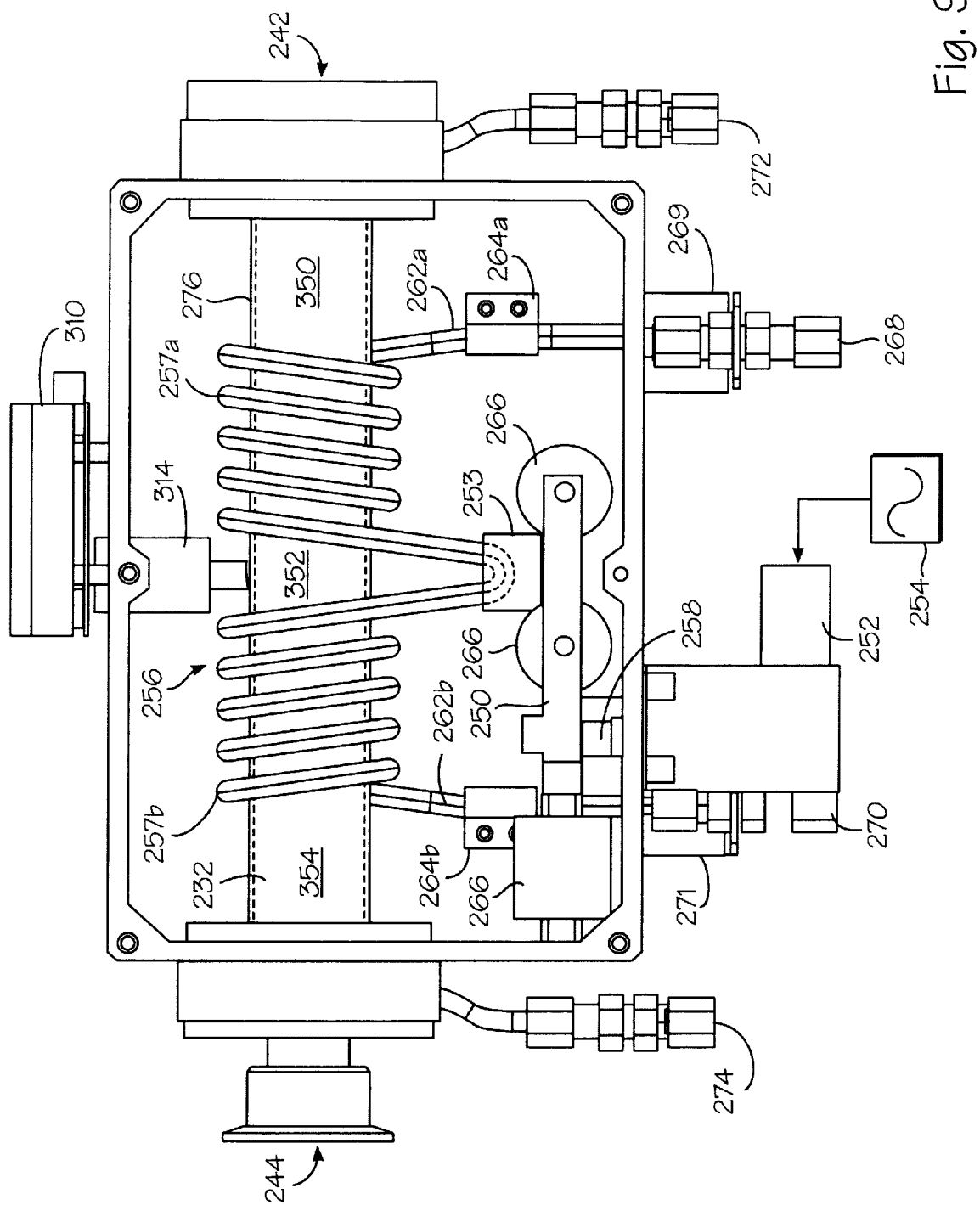
FIG. 9 is a top view of the plasma generator of FIG. 8 with the magnetic device removed in order to expose the RF coils.
Figure 10:
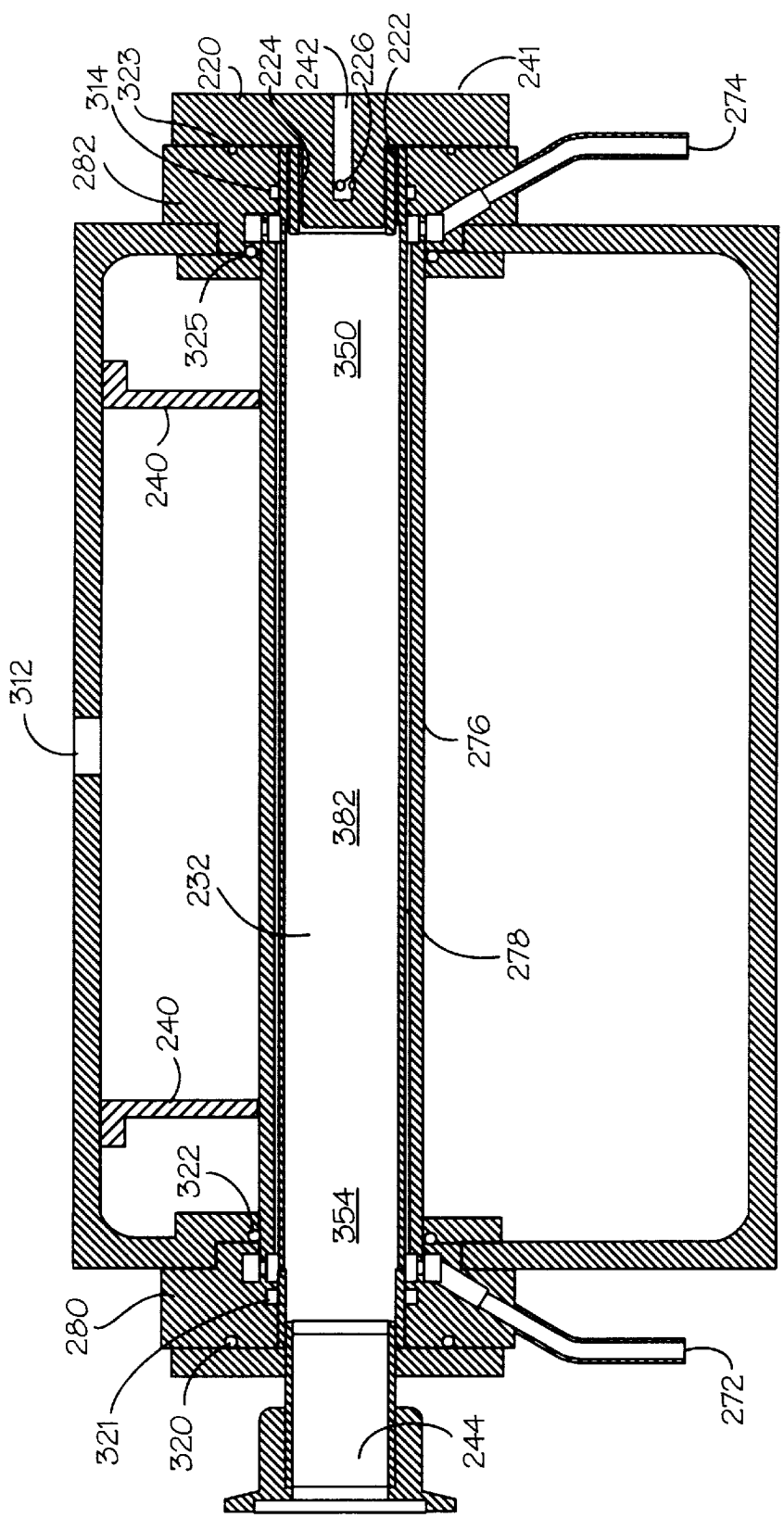
FIG. 10 is a partial cross-sectional top view of the plasma generator shown in FIG. 9.

FIGS. 8, 9 and 10 illustrate a plasma generator 212 in another embodiment of the present invention. The plasma generator 212 includes a housing 230, generation chamber 232, a radio frequency generator 234 and a magnetic device 236 mounted within the housing 230. The radio frequency generator 234 is used to generate a reactive ion plasma within the generation chamber 232 and the magnetic device 236 is used to control the reactive ion plasma within the generation chamber 232. A gas inlet 242 is provided at a first end of the generation chamber 232 and an opposing second end of the generation chamber 232 includes an opening with a much larger outlet 244. The plasma generator housing 230 is electrically coupled to a ground 238.

The radio frequency generator 234 includes a bracket 250, a connector 252, a radio frequency source 254, and a coil 256. Coil 256 includes two spiral sections 257a and 257b and is coupled to bracket 250 by bracket 253. Coil 256 is generally of a tubular construction and is typically made of copper with an external silver plating.

The bracket 250 and the connector 252 are located on opposing sides of a wall of the housing 230 and a link 258 electrically connects the bracket to the connector 252. Bracket 250 is electrically isolated from housing 230. The radio frequency source 254 is connected to the connector 252 so that alternating current within the radio frequency range is supplied to the bracket 250.

Coil 256 is generally electrically coupled to bracket 250 at a midpoint between the two spiral sections 257a and 257b. Coil section 257a spirals around the generation chamber 232 between a middle section 352 and an inlet section 350 of chamber 232. Coil 257b, on the other hand, spirals around the generation chamber 232 between the middle section 352 and an outlet section 354 of the chamber. A first end 262a of coil 256 is mounted to a wall of the housing 230 by means of a bracket 264a. A second end 262b of coil 256 is also mounted to a wall of the housing 230 by means of a bracket 264b. Brackets 264a and 264b are grounded, thereby eliminating the need for a cooling water loop as was described in connection with the embodiment of FIG. 2. The brackets 253, 241, 264a and 264b support the coil 256 substantially concentrically around the generation chamber 232. Alternating current can thus be supplied to coil 256, and thus, spiral sections 257a and 257b, by operation of the radio frequency source 254.

Each of coil sections 257a and 257b typically has about five to ten turns. It is appreciated, however, that the invention is not limited to any specific number of coil turns. The number of turns will generally increase with the dimensions of the generation chamber 232 in order to ensure sufficient coverage around the generation chamber. In addition, coil sections 257a and 257b are configured such that the magnetic fields generated by each of the sections are synchronized. That is, the coils are wrapped around the chamber 232 in the same direction. As a result, the magnetic fields generated by each of the coil sections 257a and 257b are added together in the region between the two coil sections. By effectively doubling the magnetic force between coil sections 357a and 357b, the ionization of the gas within the middle section 352 of chamber 232 is greatly enhanced.

The split coil configuration, as shown in FIG. 9, also results in a more uniform electric field across the length of coil 256, as opposed to a coil having a single spiral section that extends along the full length of the chamber 232. In a plasma generator having a coil with a single spiral section, the electric field is concentrated within the first few loops of the coil which are located near the inlet section 350 of the chamber 232. As such, the heat generated within the inlet section of the chamber much higher than the other chamber sections. By providing a coil 256 having two spiral sections 257a and 257b, the power into the chamber 232 is more evenly distributed, resulting in a more efficient ionization process and better temperature control.

Splitting the radio frequency current between the coil sections 257a and 257b also results in a net voltage drop across the coil 256 and a higher current flow for a given power input. The higher current enhances the magnetic field that is produced by each of coil sections 257a and 257b which increases the efficiency of the system. Moreover, the voltage drop reduces the possibility of capacitance coupling between the plasma within chamber 232 and the coil 256, thereby making the plasma generation system more robust and efficient.

As previously discussed, each of coil sections 257a and 257b is coupled to a grounded bracket 262a and 262b, respectively. By grounding the respective ends of the coils sections, the likelihood of producing secondary plasma within the inlet section 350 and outlet sections 354 of chamber 232 is greatly reduced since there is little, or no, electric field within these sections of the chamber to induce ionization of the gas. In addition, since there is essentially no voltage potential between the end coils of spiral sections 257a and 257b and the adjacent plasma generator components located at the gas inlet 242 and plasma outlet 244 of the chamber 232, the possibility of capacitance coupling occurring within sections 350 and 354 is greatly reduced. The likelihood that sputtering will occur within sections 350 and 354 is also reduced.

Capacitors 266 bridge the bracket 250 and a wall of the housing 230. The capacitors 266 are selected to match the frequency supplied by the radio frequency source with the conductance characteristics of the coil 256 so that the alternating power delivered to the coils is tuned for optimal reasons.

A water inlet connector 268 and a water outlet connector 270 extend through a wall of the housing 230. The water inlet and outlet connectors are located outside housing 230 and are supported by brackets 269 and 271, respectively. Water inlet connector 268 is coupled to the first end 262a of coil 256, whereas the water outlet connector 270 is coupled to the second end 262b of the coil. Water 274 can thus be introduced into the water inlet connector 268, whereafter the water flows through coil 256 and out of the water outlet connector 270. The temperature of the coil 256 is therefore controlled by the flow of water through tubular portion of coil 256. By controlling the temperature of coil 256, variations in the electrical characteristics (e.g., inductance, resistance, etc.) of the coil 256 are minimized permitting a better control of the ionization process.

The magnetic device 236 is in the form of tubular member 280 located around the coil 256. In one embodiment, tubular member 280 has four permanent magnets 282 attached to an inner surface thereof. The magnets 282 extend along the length of the tubular member 280. The tubular member 280 is made of a magnetically conductive material to provide a closed loop path for the magnetic fields generated by magnets 282. The magnetic device 236 is configured such that the ions produced within the chamber 232 are confined within a central region of the chamber, away from the internal wall of the chamber. In one such embodiment, magnets 282 oppose one another with the generation chamber 232 located between the magnets 282. The magnets create a magnetic field of between 200 and 4000 Gauss, typically about 2000 Gauss. The magnetic field created by the magnets may be adjusted to meet the performance requirements of a particular application.

Figure 11:
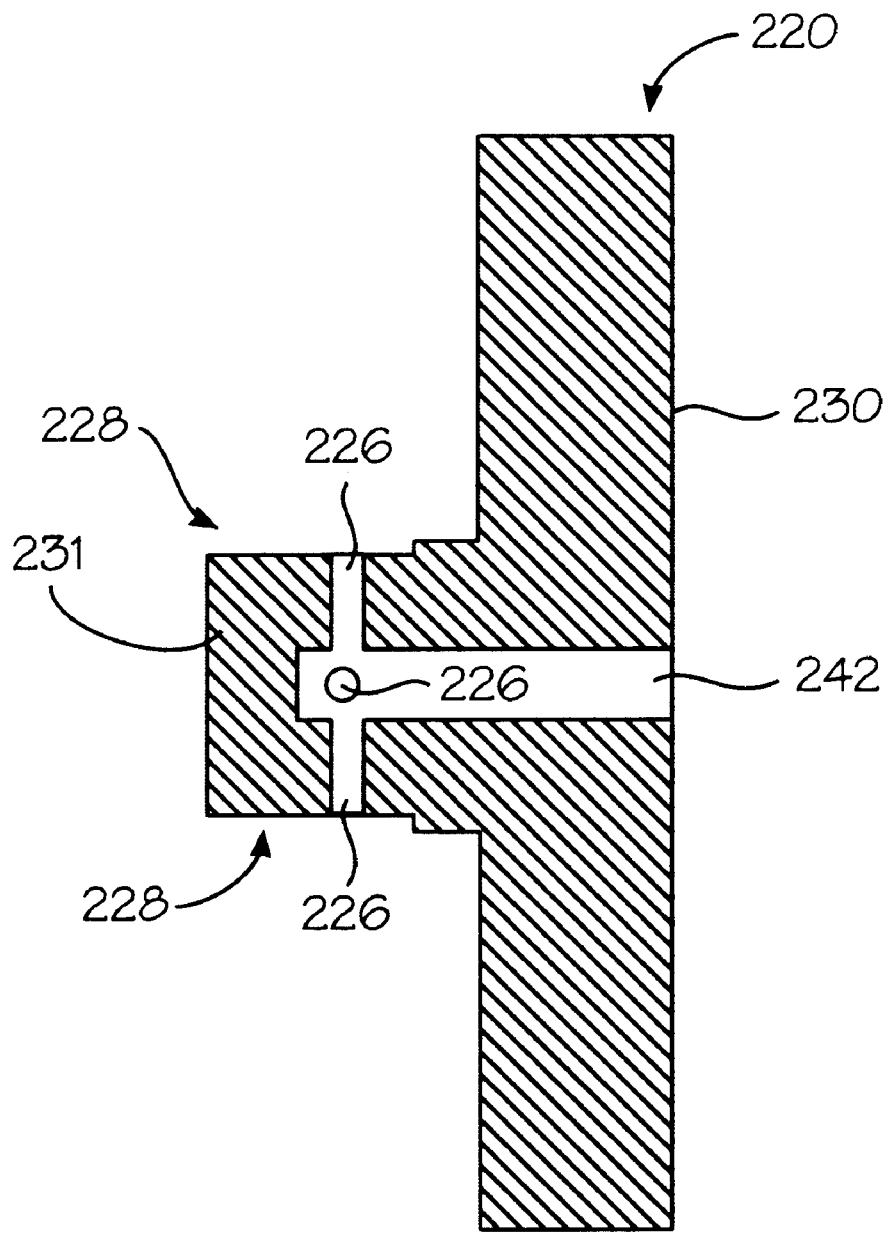
FIG. 11 is a cross-sectional side view of the gas inlet adapter shown in FIG. 10.

Turning now to FIG. 10, a partial cross-sectional top view of plasma generator 212 is shown. A gas inlet assembly 241 is provided for directing and disbursing a gas into the inlet section 350 of chamber 232. The gas inlet assembly 241 includes a gas inlet adapter 220 and a sleeve 222. As shown in FIG. 11, inlet adapter 220 includes a flange section 230, a protruding cylindrical portion 231 and a gas inlet 242 that is connectable to a gas source (not shown). A plurality of distribution holes 226 are provided within the gas inlet passage to distribute a gas around the periphery of cylindrical portion 231. Pursuant to one embodiment of the invention, the inlet adapter has an inlet diameter of 0.188 inches and contains four distribution holes 226, each of the holes having a diameter of 0.098 inches. A recess 228 along the periphery of cylindrical portion 231 produces an annular gap between the inlet adapter 220 and sleeve 222 when the components are assembled within the plasma generator 212. The annular gap has a thickness of about 0.065 inches. By introducing the gas into the chamber 232 through the annular gap, the gas is more evenly distributed into the inlet section 350 of the chamber. The gas inlet assembly configuration also prohibits the cool gas from entering the chamber 232 and impinge directly on the internal wall of the chamber 232, thereby minimizing thermal stresses in the chamber wall. The use of a thin profile annular passage for directing a gas into the chamber also reduces the likelihood that an ion will be introduced into the passage. The introduction of ions into the inlet passage could cause sputtering to occur within the passage, thus resulting in the generation of unwanted particles/contaminates.

It is important to control the temperature of the various plasma generator components to within certain prescribed limits. For example, it is important to control the temperature of the magnets 282 since the magnets will begin to demagnetize when they reach a certain threshold temperature. O-rings in the system must also be maintained below a certain temperature, otherwise the o-ring coating (e.g., Teflon) will melt. In addition, some form of temperature control is necessary to maintain temperature gradients within the sapphire chamber 232 to within acceptable limits.

In accordance with one embodiment of the present invention, a cooling jacket or casing 276 is provided around generation chamber 232. The casing 276 is sized such that a cooling medium channel 278 is disposed between the inner wall of casing 276 and the external wall of chamber 232. A cooling medium inlet connection 272 is provided at one end of the generation chamber, while a cooling medium outlet connection 274 is provided at the opposing end of the chamber. Cooling of the chamber 232 is achieved by directing a cooling medium into connector 272, through cooling channel 278, and out connection 274. The cooling medium preferably comprises compressed air, but may include other types of cooling mediums. Compressed air is a preferred cooling medium since it easily accommodates the attachment of a conventional leak detection device at the outlet connection 274. Additionally, if a leak exists within chamber 232, the introduction of air into the system will not cause damage to the plasma generator or the semiconductor processing chamber.

The plasma generator 212, as depicted in FIGS. 8 through 10, is configured to accommodate compressed air as the cooling medium. Compressed air causes a high density of air molecules to flow through cooling channel 278 and also induces turbulent flow through cooling channel. Each of these factors contribute to enhancing the efficiency of the cooling system. Connections 272 and 274 are coupled to channel 278 through an inlet manifold 280 and an outlet manifold 282, respectively. In one embodiment, the air flow channel 278 has a thickness of approximately 0.04 inches and a length of approximately 10 inches.

Figure 12:
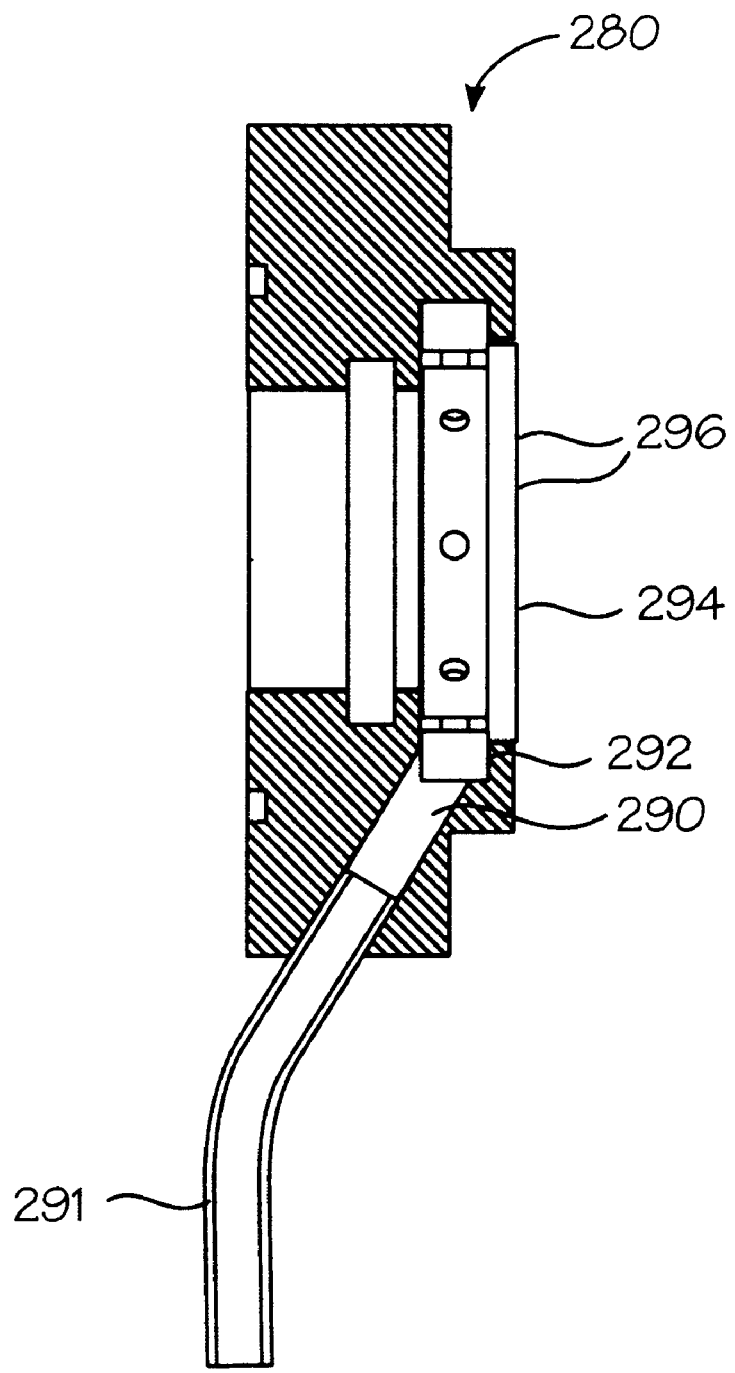
FIG. 12 is a cross-sectional side view of the cooling medium inlet manifold shown in FIG. 10.

FIG. 12 is an enlarged view of inlet manifold 280. Outlet manifold 282 typically has the same configuration as the inlet manifold 280 to ensure that the air flow is even throughout the length of the cooling channel 278. The inlet and outlet manifolds 280 and 282 are placed near the plasma generator o-rings 320 through 325 to provide cooling to the o-rings.

Inlet manifold 280 includes an inlet port 290 in which the air inlet tubing 291 is attached. The inlet port 290 is coupled to an annular distribution ring 294 that contains a plurality of spaced apart apertures 296. Compressed air enters the inlet port 290 of manifold 280 and is evenly distributed into the cooling channel 278 through the apertures 296 in the distribution ring 294. In one embodiment, inlet tubing 291 comprises ¼ inch tubing having an inside diameter of 0.219 inches with the distribution ring 294 containing eight apertures 296, each aperture having a diameter of 0.109 inches. The combined area of apertures 296 is significantly greater than the inside area of tubing 291. This ensures that the air flow is not restricted after it has been introduced into the inlet connection 272. The expanding flow volume within inlet manifold 280 also creates a cooling effect due to the expansion of the compressed air flowing into the inlet manifold. In order to induce a cooling of the compressed area, it is desirable to provide a relatively large volume expansion ratio between the cooling medium inlet tubing 291 and the inlet manifold 280. For example, in one embodiment, the volume expansion ratio within the inlet manifold is approximately ⅒.

It is important to note that the present invention is not limited by the manner in which the plasma generator is cooled. For instance, in lieu of using compressed air as the cooling medium, an inert gas, or other cooling medium, such as deionized water may be used. Other forms of cooling, such as water coils, may be used in lieu of the cooling jacket described above.

Note also that the water and air connections 268, 270, 272 and 274 are located external to the plasma generator housing 230. Therefore, any leakage at these connections will not result in the discharge of air or water into the interior of the housing.

An ionization detection assembly 310 is attached to the outside of housing 230 by a bracket 311. An opening 312 in housing 230 is provided for accommodating a connector that couples assembly 310 to an ionization detector 314. The split configuration of coil 256 permits the ionization detector 314 to be placed at the middle section 352 of chamber 232 where the majority of the ionization occurs, thus providing an accurate indication of the ionization process.

The foregoing description has been directed primarily at a system which includes a semiconductor processing chamber which is made of aluminum, and which is cleaned with a reactive fluorine ion plasma. Other semiconductor processing chambers may exist or may in the future be designed which are made of materials which are attacked by fluorine ions. Other reactive ion plasmas would thus be utilized in order to clean these other semiconductor processing chambers. Quartz is an example of a material which is attacked by fluorine ions. A chlorine containing gas, such as $Cl_2$, may, for example, be utilized for a semiconductor processing chamber which is made of quartz. $Cl_2$ dissociates into $Cl^-$ ions which would be suitable for purposes of cleaning a quartz containing semiconductor processing chamber. $Cl^-$ is also aluminum and stainless steel "friendly" so that the processing chamber may be made partially of quartz and partially of stainless steel or aluminum.

Although the foregoing description has been directed primarily at cleaning of a semiconductor processing chamber, it should be understood that other equipment, such as interconnecting pipes, may also be cleaned in a similar manner.

What is claimed is:

1. An apparatus comprising:
    a chamber having an inlet opening at a first end, an outlet opening at a second end, an internal surface and an external surface;
    an electrically conductive coil disposed around at least a portion of the external surface of the chamber connectable to an alternating current source for forming a reactive ion plasma in the chamber, the coil having a cooling channel therethrough; and
    a thermally conductive electrically insulative member disposed substantially around and in contact with at least a portion of the external surface of the chamber and, at least a portion of the electrically conductive coil being thermally connected to the thermally conductive member.

2. The apparatus of claim 1 further comprising magnet means creating a magnetic field confining ions to an area within the chamber, the area being away from the internal wall.

3. The apparatus of claim 1 wherein the coil emanates a frequency which dissociates a gas, when contained within the chamber, into reactive ions.

4. The apparatus of claim 3 wherein the frequency is within the radio frequency range.

5. The apparatus of claim 2 wherein the magnet means includes a first set of magnets on opposite sides of the area and a second set of magnets on opposite sides of the area.

6. The apparatus of claim 1 wherein the coil generates a vibration within the chamber within the radio frequency range.

7. The apparatus of claim 1 further comprising a semiconductor processing chamber and a conduit providing a passage between the outlet opening and the semiconductor processing chamber.

8. The apparatus of claim 1 wherein said thermally conductive member is made of a material that does not absorb magnetic fields.

9. The apparatus of claim 1 wherein the thermally conductive member is made of an aluminum nitride filled, electrically insulating and thermally conductive epoxy paste adhesive.

10. An apparatus comprising:
    a chamber having an internal surface and an external surface;
    an inlet into the chamber;
    an electrically conductive coil disposed around at least a portion of the external surface of the chamber connectable to an alternating current source, the coil having a cooling channel therethrough, the alternating current causing an alternating electromagnetic field within the chamber which transforms a gas, when contained in the chamber, into a reactive ion plasma.
    a thermally conductive electrically insulative member disposed substantially around and in contact with at least a portion of the external surface of the chamber, at least a portion of the electrically conductive coil being thermally connected to the thermally conductive member;
    magnet means creating a magnetic field confining the ions to an area within the chamber away from the internal surface;
    a semiconductor processing chamber; and
    a conduit allowing the flow of ions from a chamber outlet to the semiconductor processing chamber.

11. The apparatus of claim 10 wherein the device supplies alternating current to the electrically conductive coil at a frequency within the radio frequency range.

12. The apparatus of claim 10 wherein the magnet means is located externally of the generation chamber with the thermally conductive member located between the magnet means and the external wall of the chamber.

13. The apparatus of claim 10 wherein the thermally conductive member is made of a material that does not absorb magnetic fields.

14. The apparatus of claim 10 wherein the thermally conductive material is made of an aluminum nitride filled, electrically insulating and thermally conductive epoxy paste adhesive.

* * * * *